United States Patent [19]
Takada et al.

[11] Patent Number: 5,574,735
[45] Date of Patent: Nov. 12, 1996

[54] ERROR CORRECTION CIRCUIT WHICH SUBSTITUTES BITS INTO DATA STREAM DURING PERIODS OF DATA LOSS

[75] Inventors: Masayuki Takada; Osamu Yamada; Toru Kuroda, all of Tokyo; Koichi Yamazaki, Saitama-ken, all of Japan

[73] Assignees: Nippon Hoso Kyokai; Nippon Conlux Co., Ltd., both of Tokyo, Japan

[21] Appl. No.: 345,112

[22] Filed: Nov. 28, 1994

[30] Foreign Application Priority Data

Nov. 29, 1993 [JP] Japan ................................ 5-298345

[51] Int. Cl.$^6$ .................................................. H03M 13/00
[52] U.S. Cl. .................... 371/37.1; 371/38.1; 371/39.1; 371/40.1; 371/45
[58] Field of Search ............................... 371/37.9, 37.1, 371/37.4, 38.1

[56] References Cited

U.S. PATENT DOCUMENTS 5,050,171  9/1991  Ishijima ................................ 371/47.1
5,379,305  1/1995  Weng .................................... 371/41

OTHER PUBLICATIONS

Michelson, Arnold M. and Levesque, Allen H. Error–Control Techniques for Digital Communication. Jan. 1985 pp. 160–162.

*Primary Examiner*—Roy N. Envall, Jr.
*Assistant Examiner*—Yoncha L. Kundupoglu
*Attorney, Agent, or Firm*—Jones & Askew

[57] ABSTRACT

In an error correction circuit, when a data loss is detected, substitute data comprising all bits of "1" or "0" are generated during a data loss period and substituted for the lost data for the data loss period. Thereafter, the whole data containing the substitute data are decoded in a predetermined error correction system to generate corrected data.

7 Claims, 6 Drawing Sheets

ERROR CORRECTION CIRCUIT WHICH SUBSTITUTES BITS INTO DATA STREAM DURING PERIODS OF DATA LOSS

BACKGROUND OF THE INVENTION

1. Field of the Invention

This invention relates to an error correction circuit for correcting errors of data recorded on an information recording medium, and particularly to an error correction circuit for correcting errors of data recorded on an information-writable recording medium using an MFM-RZ encode system (for example, an optical card or the like).

2. Description of Related Art

Various kinds of encode systems such as an NRZ (non-return-to-zero) encode system, an MFM (modified frequency modulation) encode system, an MFM-RZ (modified frequency modulation-return-to-zero) encode system have been known as an encode system for data recording and reproducing operations on and from an information-writable recording medium such as an optical card or the like.

In order to read out data which are recorded on an information recording medium in one of the NRZ encode system, the MFM encode system, the MFM-RZ encode system, etc., the data are input to an error correction circuit to correct errors of the data. If a syndrome represents "0", the error correction would succeed, and thus accurate data could be obtained. On the other hand, if the syndrome represents "1", the error correction would fail.

FIG. 4 is a timing chart showing the encoding of the NRZ encode system, the MFM encode system and the MFM-RZ encode system.

A first (uppermost) stage (a) of FIG. 4 represents a bit sequence of data to be recorded, a second stage (b) of FIG. 4 represents a recording operation of the NRZ encode system for the data, a third stage (c) of FIG. 4 represents a recording operation of the MFM encode system for the data and a fourth (lowermost) stage (d) of FIG. 4 represents a recording operation of the MFM-RZ encode system for the data.

In the NRZ encode system, the polarity of current to be supplied for recording is varied in accordance with the data bit sequence. For example, as shown at the stages (a) and (b) of FIG. 4, the recording current flows forwardly (positively) when a bit to be recorded (hereinafter referred to as "record-target bit") is "1", and on the other hand it flows backwardly (negatively) when the record-target bit is "0". Accordingly, this encode system performs a data recording operation with no period for which the current is equal to zero, thereby improving the recording density.

In the MFM encode system, inversion of magnetization for recording is controlled in accordance with the data bit sequence. For example, as shown at the stages (a) and (c) of FIG. 4, the inversion of magnetization is made when the record-target bit is "1", no inversion of magnetization is made when the record-target bit is "0" and it follows no "0" bit (that is, the bit next to the record-target bit is not "0" bit), and the inversion of magnetization is made when the record-target bit is "0" and it follows at least one "0" bit, that is, at least the bit next to the record-target bit is "0"), whereby the recording density is improved and a self-synchronizing clock signal can be reproduced.

In the MFM-RZ encode system, current supply for recording is controlled in accordance with the rise-up and falling of the bits obtained in the MFM encode system. For example, as shown at the stages (a) and (d) of FIG. 4, current flows for a predetermined period (bit width) at the time when the bits rise up or fall down. Therefore, the reproduction of the self-synchronizing clock signal can be easily performed when the data are read out, and the reproduction of a data read-out timing can be easily performed. In this system, when a data bit is read out at the center of a data period, the data bit is judged to be "1" when the leading edge exists at the center of the data period while the data bit is judged to be "0" when no leading edge exists at the center of the data period.

In the error correction circuit as described above, when the information recording medium is scratched or the like, it may be partially damaged due to the scratch to disturb detection of edges. The disturbance of the detection of edges causes a data loss area where data are continuously lost. FIG. 5 is a timing chart showing a data loss. The stages (a) to (d) are identical to those of FIG. 4, and the bottom stage (e) of FIG. 5 shows a data loss. For example, as shown in the bottom stage (e) of FIG. 5, data are continuously lost in a data loss area, and data error correction cannot be performed in this data loss area by the error correction circuit.

Accordingly, in the error correction circuit as described above, when a data loss area occurs, the error correction is generally performed by setting all data in the data loss area (during a data loss period) to "0", thereby making data decoding possible.

Setting all lost data to "0" as described above can decode all the data without any error if the data were all originally "0's". However, it will not result in error correction if these data were originally "1".

That is, when data are lost due to scratches on the information recording medium, the error rate can be reduced if the original data were '0's'. However, the error rate increases if the original data were "1's". Therefore, the data error rate is dependent on the content of the original data.

SUMMARY OF THE INVENTION

An object of the present invention is to provide an error correction circuit which is capable of preventing an error rate in a decoding operation from being varied in accordance with the content of original data even when the original data are continuously lost due to scratches or the like on information recording medium, thereby greatly improving an error correction performance.

In order to attain the above objective, the first aspect of the present invention is an error correction circuit for decoding data read out from an information recording medium in a predetermined error correction system, which includes a data loss period detector for detecting data loss when at least one part of data read out from the information recording medium is lost, a substitute data generator for generating substitute data comprising all bits of "1" or "0" during a data loss period when the data loss is detected by the data loss period detector, and an error corrector for substituting the substitute data obtained in the substitute data generator for the data lost during the data loss period in the data read out from the information recording medium, and then decoding the data in the predetermined error correction system to generate corrected data.

Further, in order to attain the above object, according to a second aspect of the present invention, an error correction circuit for decoding data read out from an information recording medium in a predetermined error correction system, includes a data loss period detector for detecting data loss when at least one part of data read out from the information recording medium is lost, a substitute data generator for generating substitute data comprising all bits of "1" or "0" during a data loss period when the data loss is detected by the data loss period detector, and an error corrector for decoding the data read out from the information recording medium in the predetermined error correction system to generate corrected data, or substituting the substitute data obtained in the substitute data generator for the data lost during the data loss period in the data read out from the information recording medium when the error correction fails and then decoding the data in the predetermined error correction system to generate corrected data.

According to the error correction circuit of the first aspect of the present invention, when at least a part of the data read out from the information recording medium is lost, the data loss is detected by the data loss period detector, and during the detection of the data loss by the data loss period detector, the substitute data all bits of which are "1" or "0" are generated by the substitute data generator. In addition, the data obtained by the substitute data generator are substituted for data for the data loss period in the data read out from the information recording medium, and then the data are decoded in the predetermined error correction system to generate the corrected data.

Further, according to the error correction circuit of the second aspect of the present invention, the data read out from the information recording medium are decoded in the predetermined error correction system by the error corrector to generate the corrected data. If this error correction fails, the error corrector substitutes the data obtained by the substitute data generator for the data lost during the data loss period in the data read out from the information recording medium, and then decodes the data in the predetermined error correction system to generate the corrected data.

DETAILED DESCRIPTION OF PREFERRED EMBODIMENTS

Preferred embodiments according to this invention will be described hereunder with reference to the accompanying drawings.

Figure 1:
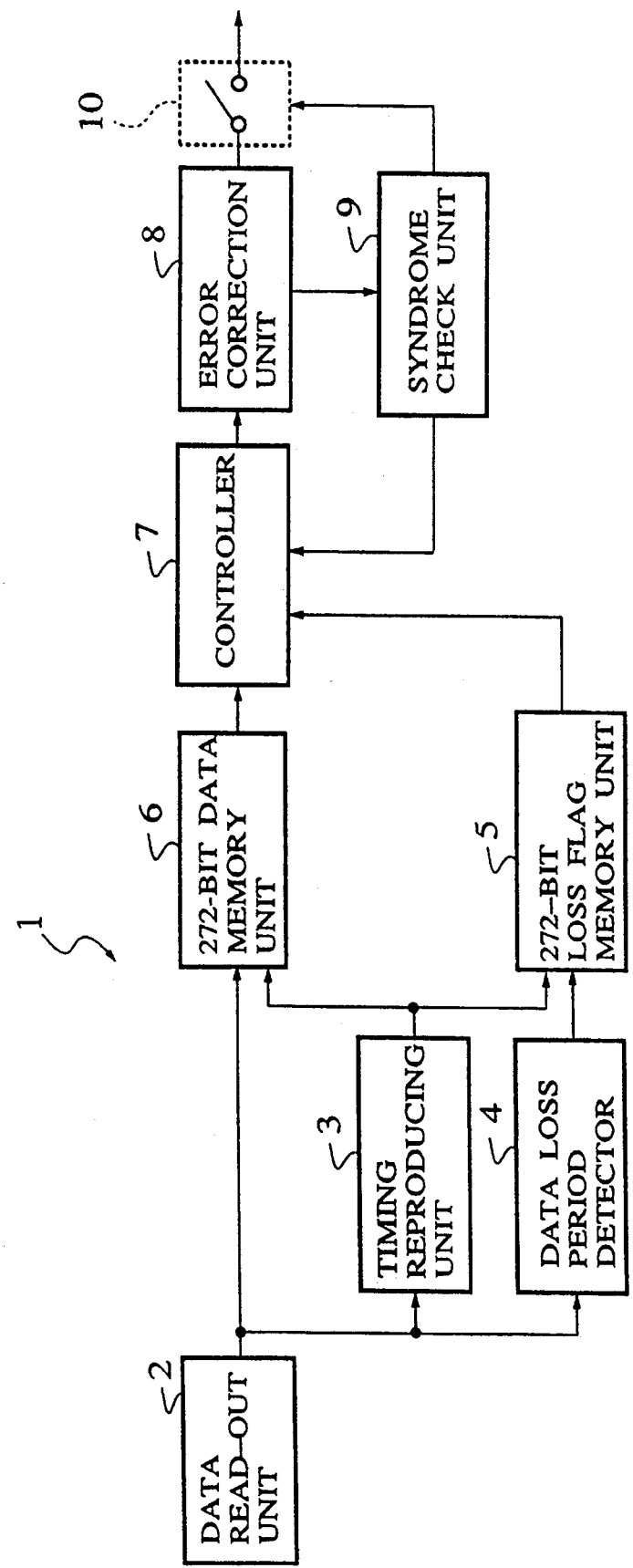
FIG. 1 is a block diagram showing an embodiment of an error correction circuit according to this invention.

FIG. 1 is a block diagram showing an embodiment of an error correction circuit according to this invention. In this embodiment, the MFM-RZ encode system and an error correction system using (272, 190) compacted difference-set cyclic code are used to perform error correction.

As shown in FIG. 1, an error correction circuit 1 includes a data read-out unit 2, a timing reproducing unit 3, a data loss period detector 4, a 272-bit loss flag memory unit 5, a 272-bit data memory unit 6, a controller 7, an error correction unit 8, a syndrome check unit 9 and a change-over switch unit 10. Further, the MFM-RZ encode system is used as a coding system.

In this embodiment, those data which have been recorded on an optical card or the like using the (272, 190) compacted difference-set cyclic code as an error correction code are read out in a decoding system for the MFM-RZ encode system. If no data loss occurs in these data, the error correction is performed using the error correction system of the (272, 190) compacted difference-set cyclic code to decode the data. On the other hand, if any data loss occurs in the data, data having all bits of "0" or "1" are substituted for the lost data portion, and the whole data containing the substitute data are subjected to the error correction using the error correction system of the (272, 190) compacted difference-set cyclic code, thereby decoding these data.

The data read-out unit 2 adopts the MFM-RZ encode system, and when reproducing data recorded on the optical card or the like using the (272, 190) compacted difference-set cyclic code, it reads out these data, and outputs them to the timing reproducing unit 3, the data loss period detector 4 and the 272-bit data memory unit 6.

The timing reproducing unit 3 is supplied with data output from the data read-out unit 2 to detect the leading edge or trailing edge of data bits and generate a timing signal required for judgment of "1" or "0" on these data bit on the basis of the detection result. The timing signal is supplied from the timing reproducing unit 3 to the 272-bit data memory unit 6 and the 272-bit loss flag memory unit 5.

The data loss period detector 4 is supplied with data output from the data read-out unit 2 to detect the presence or absence of the leading edge and trailing edge of data bits and judge on the basis of the detection result whether any data loss occurs in these data bits. If it detects a period when neither leading edge nor trailing edge exists, it judges this period as a data loss period when the data are lost due to scratches on the information recording medium, and supplies the judgment result to the 272-bit loss flag memory unit 5.

The 272-bit loss flag memory unit 5 receives the judgment result output from the data loss period detector 4 on the basis of the timing signal output from the timing reproducing unit 3. When the judgment result represents a data loss period, the 272-bit loss flag memory unit 5 sets a flag "1" representing lost data for each of data bits existing for the data loss period and also a flag "0" representing no lost data for data bits other than the lost data bits, and supplies these flags to the controller 7.

The 272-bit data memory unit 6 reads in the data output from the data read-out unit 2 bit by bit on the basis of the timing signal output from the timing reproducing unit 3 to store data of 272 bits, and supplies stored data of 272 bits to the controller 7.

The controller 7 receives the data output from the 272-bit data memory unit 6 to temporarily store these data, and supplies these data to the error correction unit 8. Subsequently, if the value of a syndrome check result output from the syndrome check unit 9 is "0", the controller 7 judges that the error correction of the data output from the controller 7 succeeds, and terminates the data processing for one-block codes (272 bits). On the other hand, if the syndrome check value is not "0", the controller 7 judges failure of the error correction, and conducts a logical sum on the data stored temporarily in the controller 7 and the data output from the 272-bit loss flag memory unit 5 (data having "1" bits only for the data loss period) to generate data having "1" bits for the data loss period. The data thus generated are supplied to the error correction unit 8.

The error correction unit 8 receives data of 272 bits (one-block codes) output from the controller 7 to subject these data to the error correction processing using the error correction system of the (272, 190) compacted difference-set cyclic code, supplies the syndrome obtained at the error correction time to the syndrome check unit 9, and supplies the data obtained in the error correction processing to the change-over switch unit 10.

The syndrome check unit 9 receives the syndrome output from the error correction unit 8 to judge whether the error correction succeeds or fails. If the error correction is judged successful, the syndrome check unit 9 generates a switch-on signal and supplies it to the change-over switch unit 10. In addition, it generates a value of "0" as a syndrome check result and supplies it to the controller 7. On the other hand, if the error correction is judged a failure, the syndrome check unit 9 generates a switch-off signal and supplies it to the change-over switch 10. In addition, it generates a value other than "0" and supplies it to the controller 7.

When the switch-on signal is output from the syndrome check unit 9, the change-over unit 10 receives the error-corrected data output from the error correction unit 8, and supplies these data to a subsequent-stage circuit (not shown). On the other hand, when the switch-off signal is output from the syndrome check unit 9, the change-over unit 10 interrupts reception of the error-corrected data, and switches its connection point to another to prevent the error data to the subsequent-stage circuit.

Next, the comparison result between this embodiment and the conventional art will be described with reference to FIGS. 2 and 3.

In this comparison experiment, data which are interleaved with 48 bits are recorded on an optical card at a one-bit storage length of 5 μm, and an occupation rate of "1"-bits to all bits on one track of the optical card and a correctable burst length are calculated for the systems of this embodiment and the conventional art. FIG. 2 is a graph showing the relationship between the rate of "1"-bits to all bits on a track and the correctable burst length when the conventional system is applied, and FIG. 3 is a graph showing the relationship between the rate of "1"-bits to all bits on one track and the correctable burst length when the error correction system of this embodiment is applied.

Figure 2:
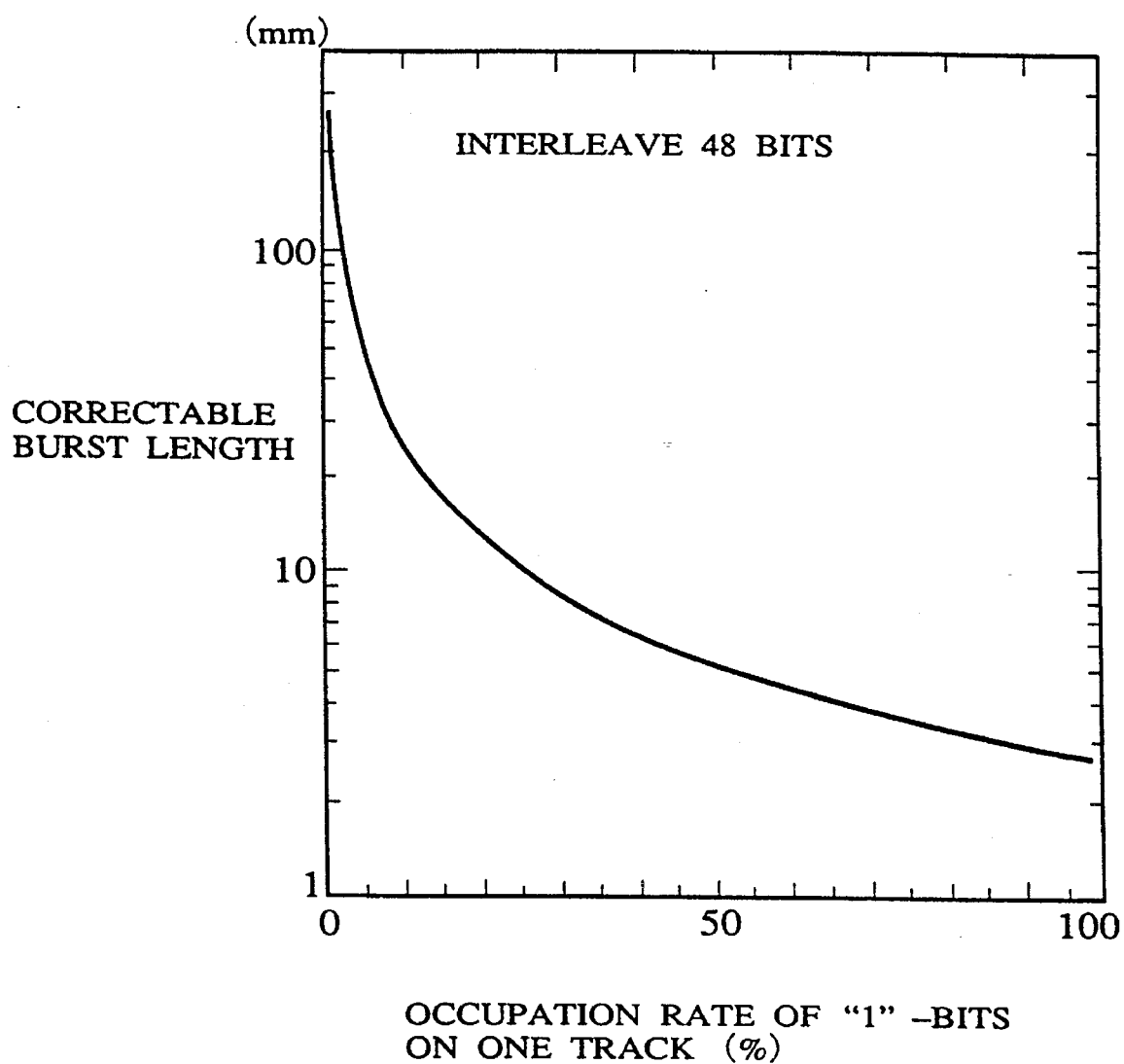
FIG. 2 is a graph showing the relationship between a rate of "1"-bits to bits on a track and a correctable burst length when a conventional system is applied.
Figure 3:
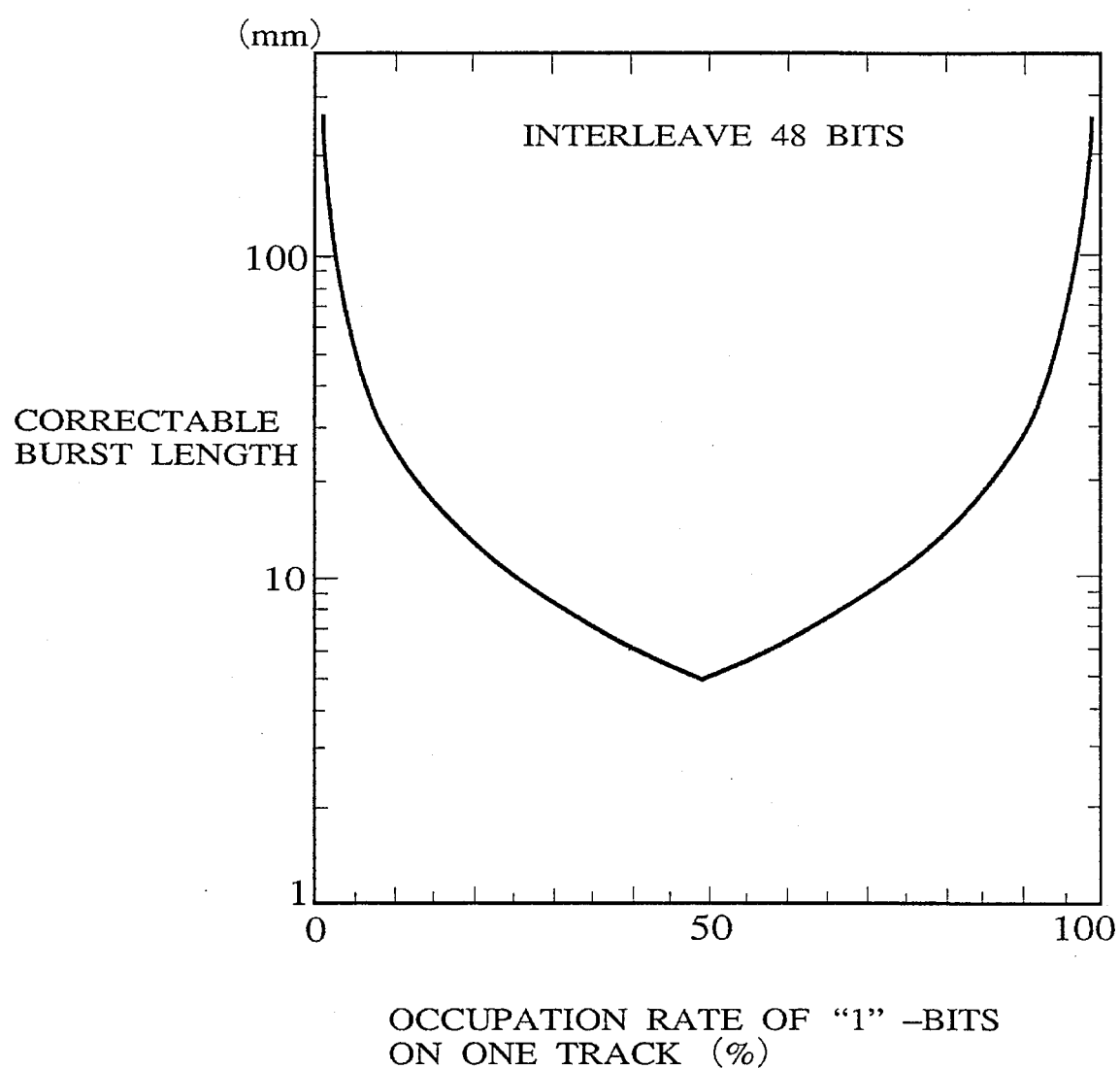
FIG. 3 is a graph showing the relationship between a rate of "1"-bits to bits on a track and a correctable burst length when the error correction system of this invention is applied.
Figure 4:
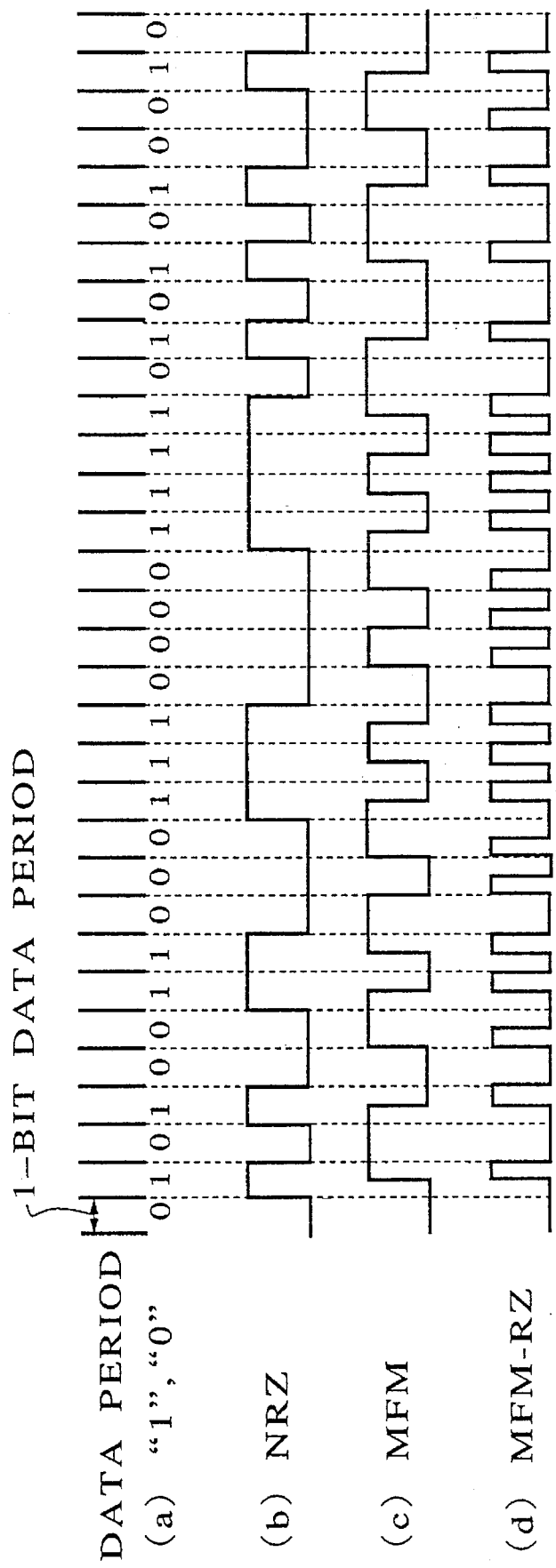
FIG. 4 is a timing chart for showing an NRZ encode system, an MFM encode system, an MFM-RZ encode system.
Figure 5:
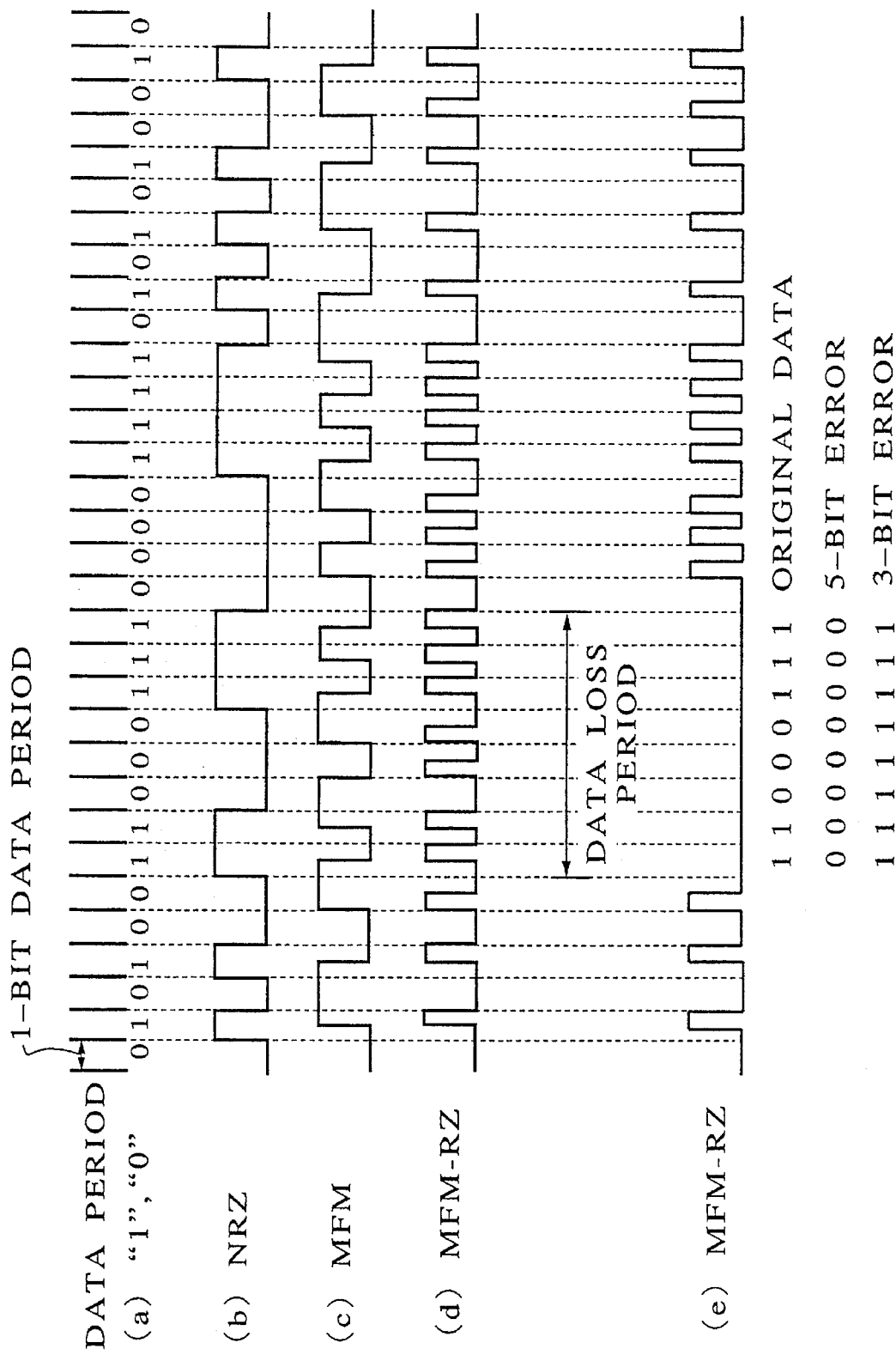
FIG. 5 is a timing chart for showing a data loss problem occurring in the NRZ encode system, the MFM encode system and the MFM-RZ encode system.

As is apparent from FIG. 2, when all the data for the data loss period are set to "0" like the conventional error correction system, the correctable burst length becomes shorter as the occupation rate of the "1"-bits on one track increases. On the other hand, as is apparent from FIG. 3, when all the data for the data loss period are set to "1" like the error correction system of this embodiment, the correctable burst length is varied like the conventional system (that is, becomes shorter) until the occupation rate of the "1"-bits reaches 50%, however, it becomes remarkably longer when the occupation rate exceeds 50%.

As described above, for the read-out of those data which have been recorded on an optical card using the MFM-RZ encode system as a coding system and the (272, 190) compacted difference-set cyclic code as an error correction code, when no data loss occurs in these data or when any data loss occurs and all data corresponding to these lost data are set to "0", the error correction is conducted on the data using the error correction system of the (272, 190) compacted difference-set cyclic code to decode the data. Further, even when the error correction cannot be performed although the data loss occurs and all the lost data are set to "0", data having all bits of "1" are substituted for the lost data, and the error correction is conducted on these data using the error correction system of the (272, 190) compacted difference-set cyclic code to decode the data. Therefore, even when the data are continuously lost due to scratches on the information recording medium, the variation of the error rate at the decoding time in accordance with the content of the original data can be suppressed, whereby the error correction performance can be greatly improved.

In the embodiment as described above, "1" is set to bits having a behavior of rising up at the center of the bit period while "0" is set to bits having the other behaviors (for example, those bits which fall down or have no variation at the center of the bit period). However, the setting of "1" and "0" to the bits may be converse. In this case, the same effect as described above can be obtained by setting the data for the data loss period to "0".

Figure 6:
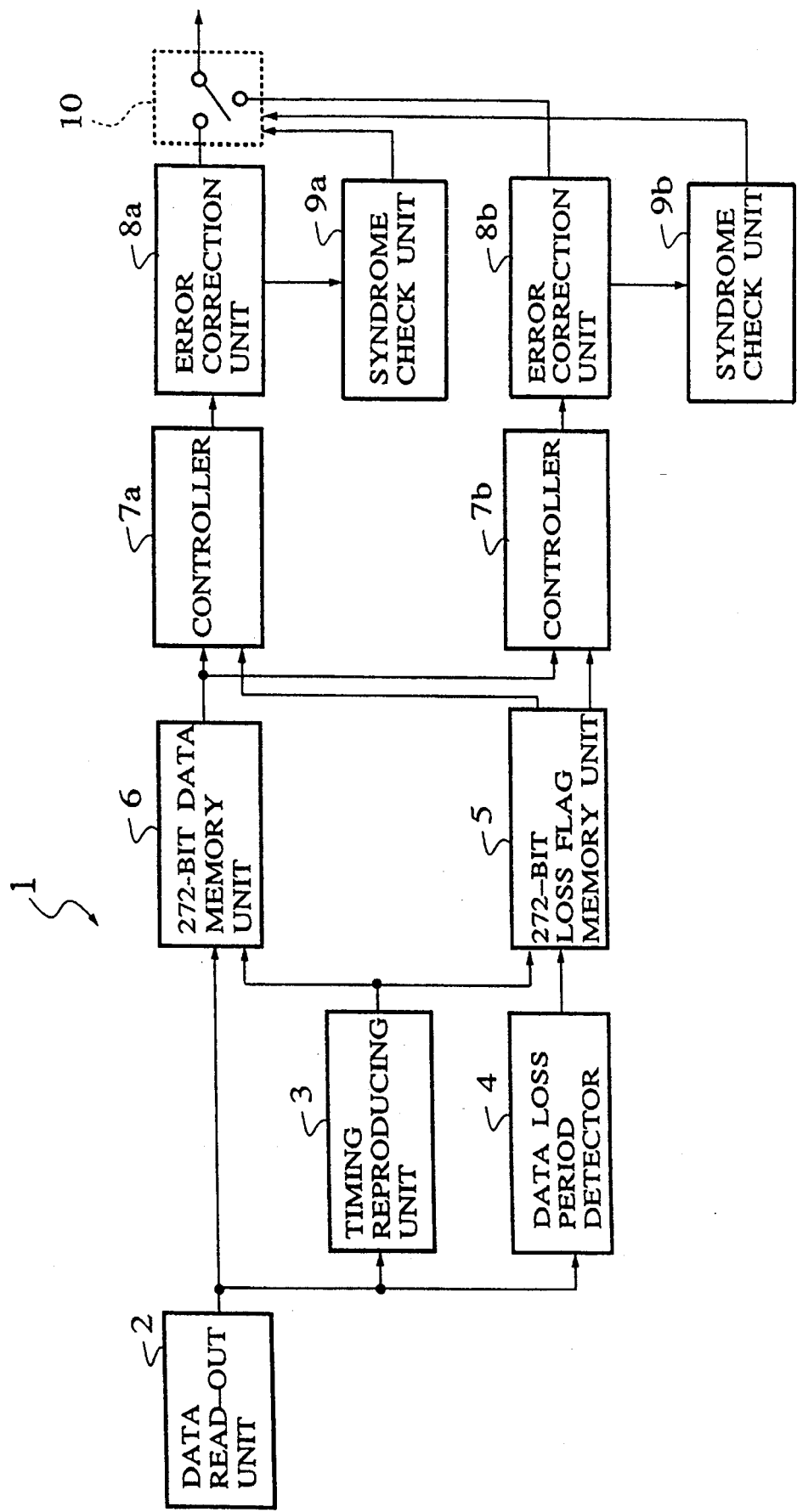
FIG. 6 is a block diagram showing another embodiment of the error correction circuit according to this invention.

FIG. 6 shows another embodiment of the error correction circuit according to this invention. In this embodiment, two systems for the error correction function are provided. One system is to set all the data for the data loss period to "0" when the data loss is detected, and this system includes a controller 7a, an error correction unit 8a and a syndrome check unit 9a. The other system is to set all the data for the data loss period to "1" when the data loss is detected, and this system includes a controller 7b, an error correction unit 8b and a syndrome check unit 9b. These systems perform the error correction in parallel to each other, and the output of one of the systems, which provides the syndrome of "0", may be selected.

According to the invention, in the case where the error correction cannot be performed due to the data loss when the data recorded on the information recording medium are read out and decoded, all the data for the data loss period are set to "1" and then the error correction is conducted again to thereby greatly improve the error correction performance when the occupation rate of the "1"-bits for the data loss period is high.

Further, even when the data are continuously lost due to scratches on the information recording medium, the variation of the error rate at the decoding time in accordance with the content of the original data can be suppressed. Therefore, the error correction performance can be greatly improved.

What is claimed is:

1. An error correction circuit for decoding data read out from an information recording medium in a predetermined error correction system, comprising:

a data loss period detector for detecting data loss when at least one part of data read out from the information recording medium is lost;

a substitute data generator for generating substitute data comprising all bits of "1" or "0" during a data loss period when the data loss is detected by said data loss period detector; and an error corrector for decoding the data read out from the information recording medium in the predetermined error correction system to generate corrected data, or when the error correction fails, substituting the substitute data obtained in said substitute data generator for the lost data for the data loss period in the data read out from the information recording medium and then decoding the data in the predetermined error correction system to generate corrected data;

wherein the data read out from the information recording medium are encoded with an MFM-RZ system and has a (272, 190) compacted difference-set cycle code as an error correction code, and said error correction unit corrects the data with the MFM-RZ system and a (272, 190) compacted difference-set cycle code system.

2. The error correction circuit as claimed in claim 1, wherein the data read out from the information recording medium are encoded with an MFM-RZ system, and said error correction unit decodes the data with the MFM-RZ system.

3. An error correction circuit for decoding data read out from an information recording medium in a predetermined error correction system, comprising:

a data loss period detector for detecting data loss when at least one part of data read out from the information recording medium is lost;

a substitute data generator for generating substitute data comprising all bits of "1" or "0" during a data loss period when the data loss is detected by said data loss period detector; and an error corrector for substituting the substitute data obtained in said substitute data generator for the lost data for the data loss period in the data read out from the information recording medium, and then decoding the data in the predetermined error correction system to generate corrected data;

wherein the data read out from the information recording medium are encoded with an MFM-RZ system and has a (272, 190) compacted difference-set cycle code as an error correction code, and said error correction unit corrects the data with the MFM-RZ system and a (272, 190) compacted difference-set cycle code system.

4. An error correction circuit for decoding data read out from an information recording medium in a predetermined error correction system, comprising:

a data loss period detector for detecting data loss when at least one part of data read out from the information recording medium is lost;

a substitute data generator for generating substitute data comprising all bits of "1" or "0" during a data loss period when the data loss is detected by said data loss period detector; and an error corrector for substituting the substitute data obtained in said substitute data generator for the lost data for the data loss period in the data read out from the information recording medium, and then decoding the data in the predetermined error correction system to generate corrected data, wherein said substitute data generator includes;

a 272-bit loss flag memory unit receiving a judgment result output from output from said data loss period detector, and said 272-bit loss flag memory unit, when the judgment result from said data loss period detector represents a data loss period, setting a flag "1" representing lost data for each of data bits existing for the data loss period and also a flag "0" representing no lost data for data bits other than the lost data bits, a 272-bit data memory unit reading in data from said information recording medium to store data of 272 bits, and a controller conducting a logical sum on the data from said 272-bit data memory unit and the data from said 272-bit loss flag memory unit to generate a substitute data having "1" bits for the data loss period.

5. The error correction circuit as claimed in claim 4, further comprising a syndrome check unit judging whether an error correction of said error corrector succeeds or fails.

6. An error correction circuit for decoding data read out from an information recording medium in a predetermined error correction system, comprising:

a data loss period detector for detecting data loss when at least one part of data read out from the information recording medium is lost;

a substitute data generator for generating substitute data comprising all bits of "1" or "0" during a data loss period when the data loss is detected by said data loss period detector: and an error corrector for substituting the substitute data obtained in said substitute data generator for the lost data for the data loss period in the data read out from the information recording medium, and then decoding the data in the predetermined error correction system to generate corrected data, wherein said substitute data generator includes;

a 272-bit loss flag memory unit receiving a judgment result output from output from said data loss period detector, and said 272-bit loss flag memory unit, when the judgment result from said data loss period detector represents a data loss period, setting a flag "1" representing lost data for each of data bits existing for the data loss period and also a flag "0" representing no lost data for data bits other than the lost data bits, a 272-bit data memory unit reading in data from said information recording medium to store data of 272 bits, and a first controller conducting a logical sum on the data from said 272-bit data memory unit and the data from said 272-bit loss flag memory unit to generate a substitute data having "1" bits for the data loss period, and a second controller conducting a logical sum on the data from said 272-bit data memory unit and the data from said 272-bit loss flag memory unit to generate a substitute data having "0" bits for the data loss period; and the second error corrector includes;

a first error corrector for substituting the substitute data obtained in said first controller for the lost data for the data loss period, and a second error corrector for substituting the substitute data obtained in said second controller for the lost data for the data loss period.

7. The error correction circuit as claimed in claim 6, further comprising:

a first syndrome check unit judging whether an error correction of said first error corrector succeeds or fails; and a second syndrome check unit judging whether an error correction of said second error corrector succeeds or fails.

* * * * *